(12) United States Patent
Sasaki et al.

(10) Patent No.: US 7,760,511 B2
(45) Date of Patent: Jul. 20, 2010

(54) ELECTRICAL CONNECTION BOX

(75) Inventors: Yoshikazu Sasaki, Yokkaichi (JP);
Yukinori Kita, Yokkaichi (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 662 days.

(21) Appl. No.: 11/793,330

(22) PCT Filed: Aug. 8, 2006

(86) PCT No.: PCT/JP2006/315688

§ 371 (c)(1),
(2), (4) Date: Jun. 19, 2007

(87) PCT Pub. No.: WO2007/043241

PCT Pub. Date: Apr. 19, 2007

(65) Prior Publication Data

US 2008/0130252 A1    Jun. 5, 2008

(30) Foreign Application Priority Data

Oct. 14, 2005    (JP) .............................. 2005-300599
Oct. 14, 2005    (JP) .............................. 2005-300604

(51) Int. Cl.
*H05K 5/02* (2006.01)
(52) U.S. Cl. ...................... 361/752; 361/601; 361/622; 174/520; 439/76.2
(58) Field of Classification Search ................. 361/728, 361/730, 752, 601, 605, 611, 622; 174/520; 439/76.1, 76.2
See application file for complete search history.

(56) References Cited

U.S. PATENT DOCUMENTS

| 4,963,099 | A | | 10/1990 | Sato et al. |
| 6,166,916 | A | * | 12/2000 | Jelinger ....................... 361/756 |
| 6,220,875 | B1 | * | 4/2001 | Kawakita .................... 439/76.2 |
| 6,430,054 | B1 | * | 8/2002 | Iwata .......................... 361/752 |
| 6,600,658 | B2 | * | 7/2003 | Iwata .......................... 361/752 |
| 6,602,079 | B2 | * | 8/2003 | Chiriku et al. ............. 439/76.2 |
| 7,167,377 | B2 | * | 1/2007 | Onizuka et al. ............ 361/775 |
| 7,203,073 | B2 | * | 4/2007 | Kawakita et al. ........... 361/775 |
| 7,351,911 | B2 | * | 4/2008 | Chiriku et al. ................ 174/59 |
| 7,357,650 | B2 | * | 4/2008 | Sasaki et al. ............... 439/76.2 |
| 7,364,438 | B2 | * | 4/2008 | Sasaki et al. ............... 439/76.1 |
| 7,514,629 | B2 | * | 4/2009 | Sasaki et al. .................. 174/50 |
| 7,532,458 | B2 | * | 5/2009 | Sasaki et al. ................ 361/622 |

(Continued)

FOREIGN PATENT DOCUMENTS

JP    U 1-150417    10/1989

(Continued)

*Primary Examiner*—Dameon E Levi
(74) *Attorney, Agent, or Firm*—Oliff & Berridge, PLC

(57) ABSTRACT

An electrical connection box according to the present invention includes a case including a circuit board, a bus bar which is electrically connected to the circuit board and extends outside the case, wherein the bus bar includes a horizontal portion positioned in an area outside the case and extends in a horizontal direction, a lower side holding member of the case positioned near the horizontal portion of said bus bar, and holds said horizontal portion from below or above when a force is applied to the bus bar in a direction in which the horizontal portion lowers or rises, and a recessed portion.

20 Claims, 8 Drawing Sheets

U.S. PATENT DOCUMENTS

2003/0137813 A1  7/2003  Onizuka et al.
2005/0227542 A1  10/2005  Fukushima et al.

FOREIGN PATENT DOCUMENTS

| JP | 10-035375 | 2/1998 |
| JP | A-11-250960 | 9/1999 |
| JP | A 2000-083313 | 3/2000 |
| JP | A 2000-115953 | 4/2000 |
| JP | A 2003-061227 | 2/2003 |
| JP | A 2003-164039 | 6/2003 |
| JP | A 2003-244820 | 8/2003 |
| JP | A-2004-328842 | 11/2004 |
| JP | A-2006-81289 | 3/2006 |

* cited by examiner

ELECTRICAL CONNECTION BOX

TECHNICAL FIELD

The present invention relates to an electrical connection box.

BACKGROUND ART

As an electrical connection box loaded on an automobile, such a box can have a structure in which a circuit constituent is housed in a case. The circuit constituent is constructed by including a circuit board, a bus bar (which is laid along a back surface of the circuit board), and a switching member such as a relay which is mounted on a front surface side of the circuit board. A through passage which penetrates to an outer surface side from its inner surface side is formed in the case, and a terminal part formed at an end portion of the bus bar penetrates through the through passage to face the outer surface side of the case.

This type of electrical connection box is disclosed in Patent Document 1 or the like.

[Patent Document 1]

Japanese Patent Laid-open No. 2003-164039

When the terminal part of the bus bar is in the form in which it penetrates through the through passage of the case to the outer surface side from the inner surface side as described above, there is the fear that a liquid outside the case is able to move in a gap between the inner surface of the through passage and the surface of the terminal part and enters the inside of the case due to capillarity.

The present invention is completed based on the circumstances as described above, and has an object to prevent entry of water from a penetrating portion of a terminal part in a case.

DISCLOSURE OF THE INVENTION

As means for attaining the above described object, an electrical connection box according to the first invention of the present application includes a case which houses a circuit board, a bus bar which is electrically connected to the aforesaid circuit board, and is led outside the aforesaid case, a horizontal portion which is formed in an area led outside the aforesaid case, of the aforesaid bus bar, to extend in a horizontal direction, a lower side holding member of the aforesaid case, which is formed at a position below the aforesaid horizontal portion of the aforesaid bus bar, and holds the aforesaid horizontal portion from below when a force in a direction in which the aforesaid horizontal portion lowers is applied to the aforesaid bus bar, an upper side holding member of the aforesaid case, which is formed at a position above the aforesaid horizontal portion of the aforesaid bus bar, and holds the aforesaid horizontal portion from above when a force (in a direction in which the aforesaid horizontal portion rises) is applied to the aforesaid bus bar, and a recessed portion which is formed in at least one or both of a lower side opposing wall surface opposed to the aforesaid horizontal portion of the aforesaid bus bar (of the aforesaid lower side holding member) and an upper side opposing wall surface opposed to the aforesaid horizontal portion of the aforesaid bus bar (of the aforesaid upper side holding member) and provides a clearance from the aforesaid horizontal portion.

An electrical connection box according to the second invention of the present application includes a case which houses a circuit board, a bus bar which is electrically connected to the aforesaid circuit board, and is led outside the aforesaid case, a horizontal portion which is formed in an area led outside the aforesaid case, of the aforesaid bus bar, to extend in a horizontal direction, a lower side holding member of the aforesaid case, which is formed at a position below the aforesaid horizontal portion of the aforesaid bus bar, and holds the aforesaid horizontal portion from below when a force in a direction in which the aforesaid horizontal portion lowers is applied to the aforesaid bus bar, and a recessed portion which is formed in a lower side opposing wall surface opposed to the aforesaid horizontal portion of the aforesaid bus bar, of the aforesaid lower side holding member to provide a clearance from the aforesaid horizontal portion.

An electrical connection box according to the third invention of the present application includes a case which houses a circuit board, a bus bar which is electrically connected to the aforesaid circuit board, and is led outside the aforesaid case, a horizontal portion which is formed in an area led outside the aforesaid case, of the aforesaid bus bar to extend in a horizontal direction, an upper side holding member of the aforesaid case, which is formed at a position above the aforesaid horizontal portion of the aforesaid bus bar, and holds the aforesaid horizontal portion from above when a force in a direction in which the aforesaid horizontal portion rises is applied to the aforesaid bus bar, and a recessed portion which is formed in an upper side opposing wall surface opposed to the aforesaid horizontal portion of the aforesaid bus bar, of the aforesaid upper side holding member to provide a clearance from the aforesaid horizontal portion.

ADVANTAGES OF THE INVENTION

According to the first to the third inventions, even if a liquid outside the case enters the gap between the bus bar and the lower side holding member or the upper side holding member, and moves to the inside of the case due to capillary, the gap between the bus bar and the lower side holding member or the upper side holding member is significantly enlarged in the recessed portion formed in the lower side holding member or the upper side holding member, and therefore, entry of the liquid due to capillary is shut off by the recessed portion.

Figure 1:
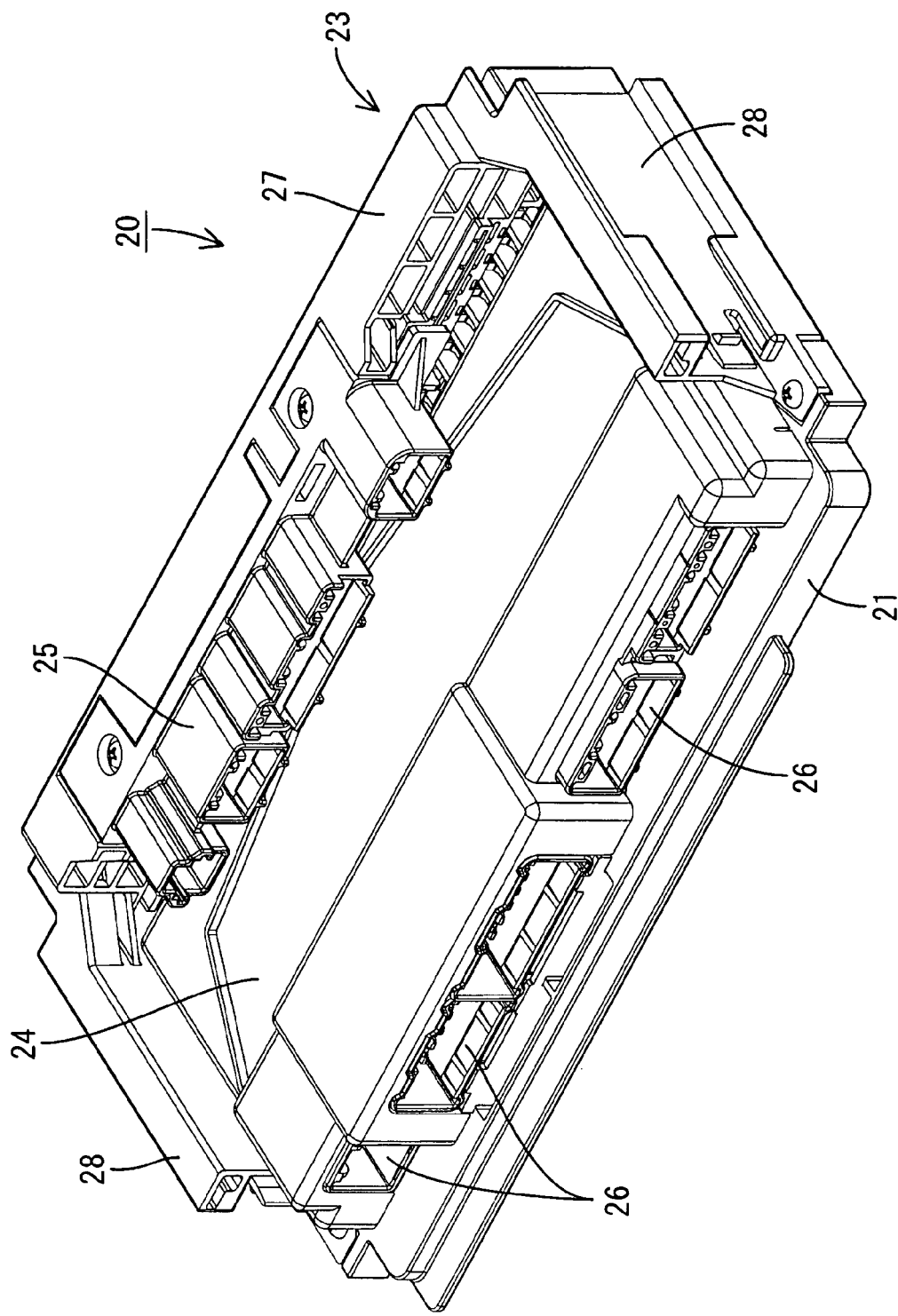
FIG. 1 is a perspective view of embodiment 1.

11 . . . circuit board
12 . . . bus bar
14 . . . horizontal portion
15 . . . fuse terminal
17 . . . narrow width portion
20 . . . case
23 . . . fuse block
29 . . . fuse mounting part
31 . . . upper side first recessed portion 32 ... upper side second recessed portion
36 ... guide part
38 ... protruded portion
40 ... positioning part
41 ... notched portion
42 ... inclined surface
43 ... rib (lower side holding member)
46 ... lower side recessed portion
60 ... upper side holding member
61 ... upper side opposing wall surface
62 ... lower side opposing wall surface

BEST MODE FOR CARRYING OUT THE
INVENTION

One embodiment of the present invention will now be described with reference to FIGS. 1 to 8. An electrical connection box of this embodiment can be loaded on an automobile interposed between a battery (not shown) and electrical equipment (not shown) such as a lamp and an audio apparatus, distributes and supplies electric power supplied from the battery to each electrical equipment, and conducts control of switching (or the like) of the electric power supply. In FIG. 1, the electrical connection box is illustrated so that the front surface (front side) faces upward, but in the state in which it is loaded on an automobile, it is in such an orientation that a body part 27 of a fuse block 23 is located at an upper side, as shown in FIGS. 2, 3, 5 and 6. The vertical and lateral orientations will be described herein after with the state in which it is loaded on an automobile as a reference.

The electrical connection box is constructed by including a circuit constituent 10 and a case 20 which houses the circuit constituent 10.

Figure 2:
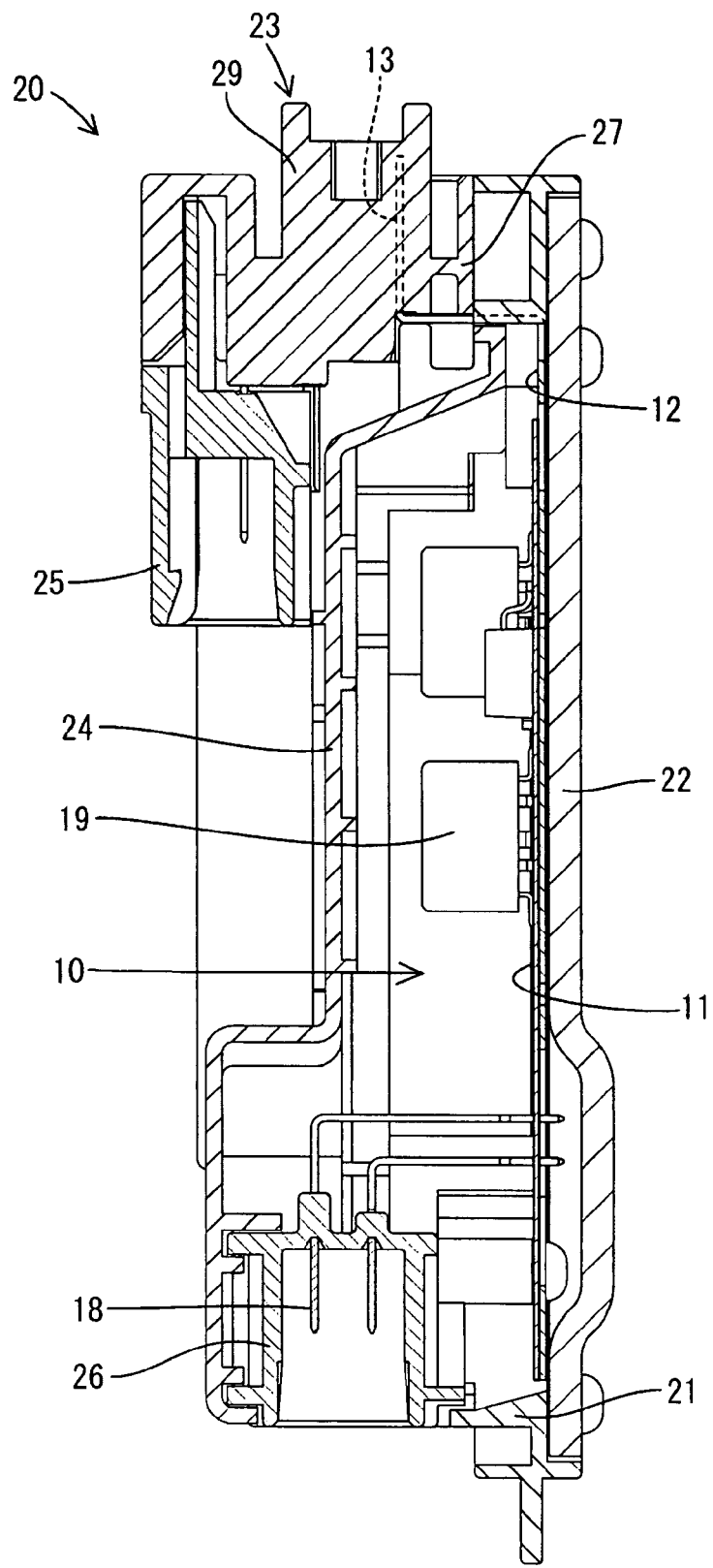
FIG. 2 is a vertical sectional view.
Figure 3:
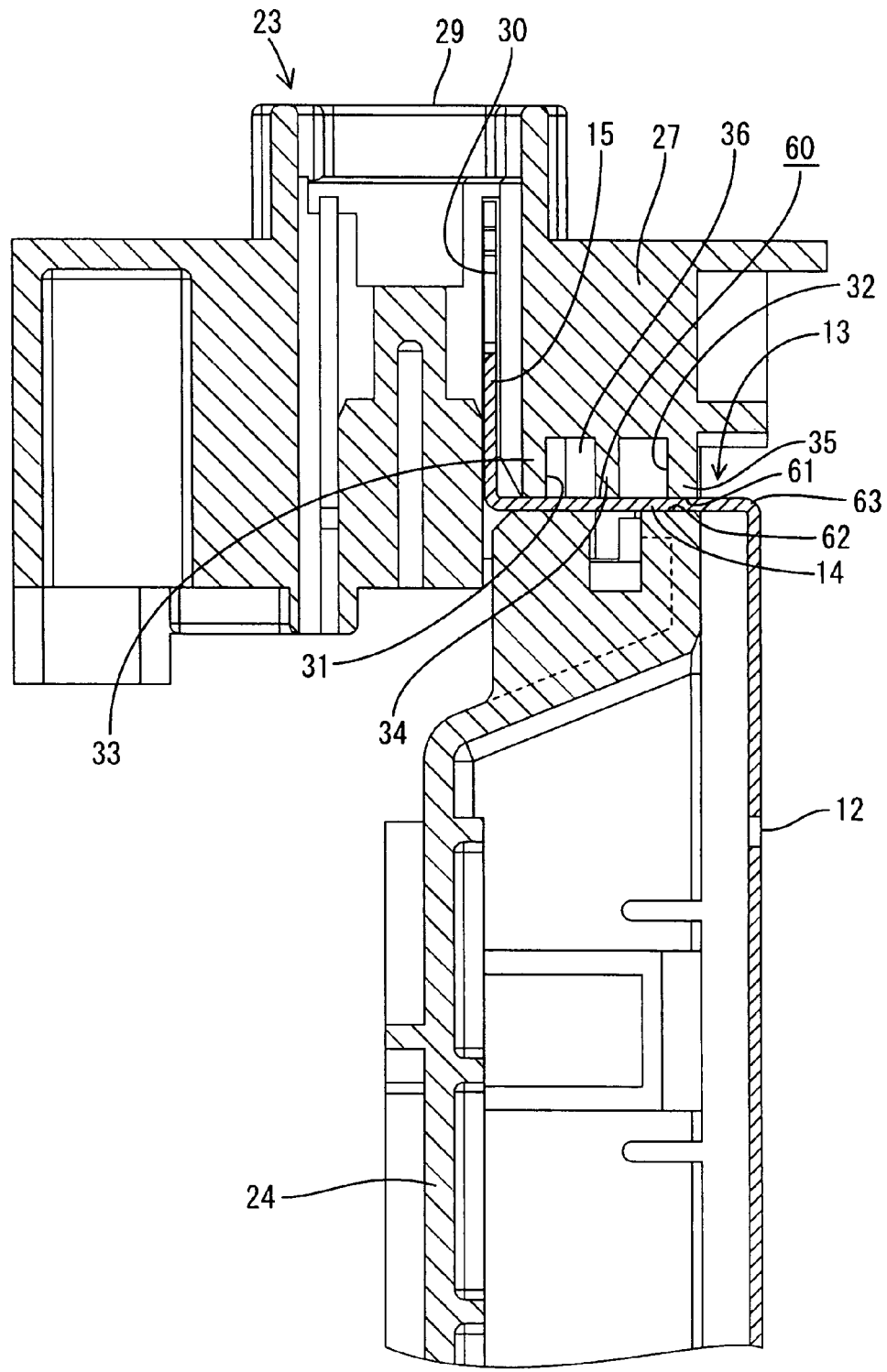
FIG. 3 is a partially enlarged vertical sectional view showing the shape of a through passage formed by a fuse block and a cover.
Figure 4:
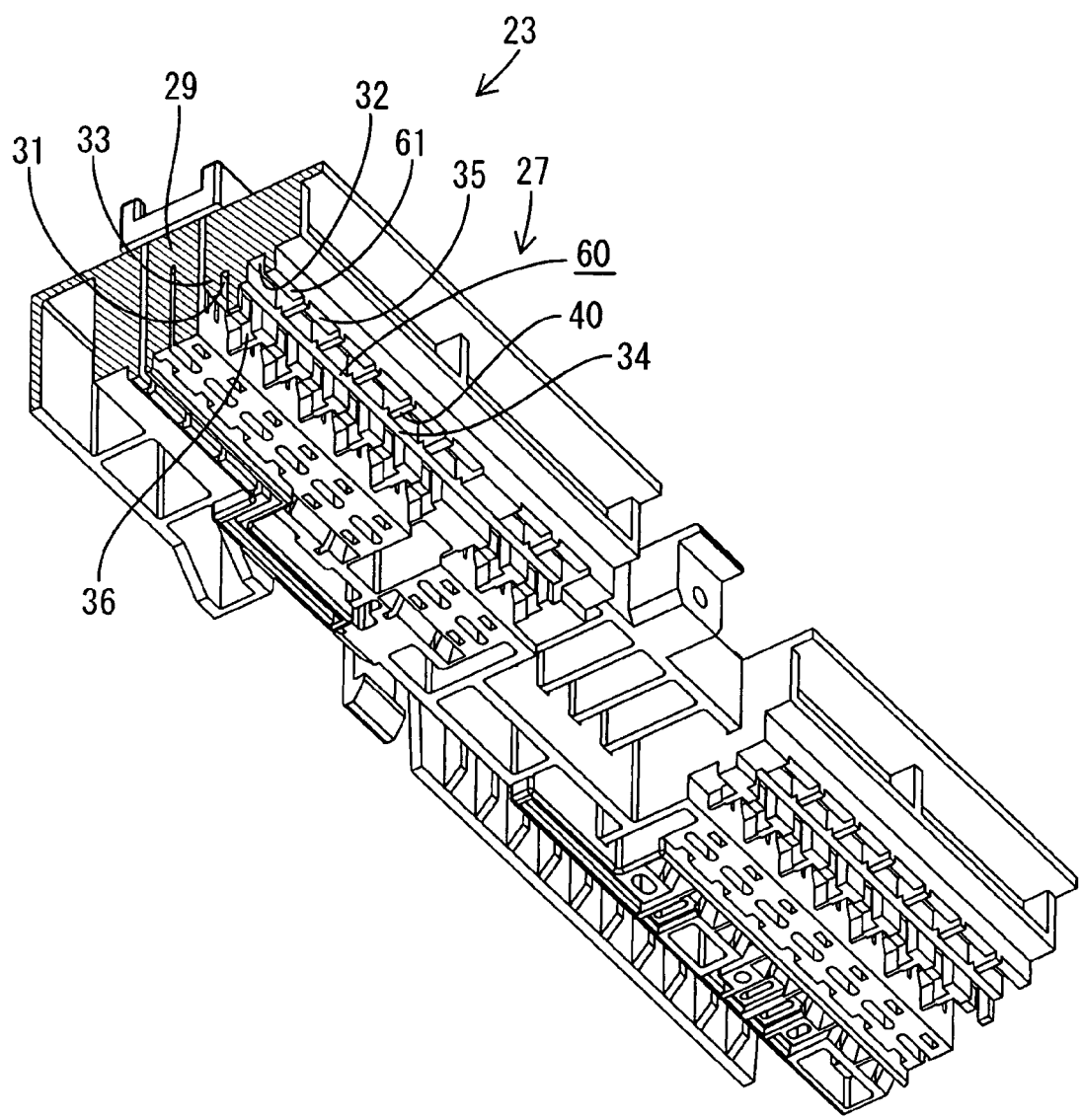
FIG. 4 is a perspective view of the fuse block seen from below.
Figure 5:
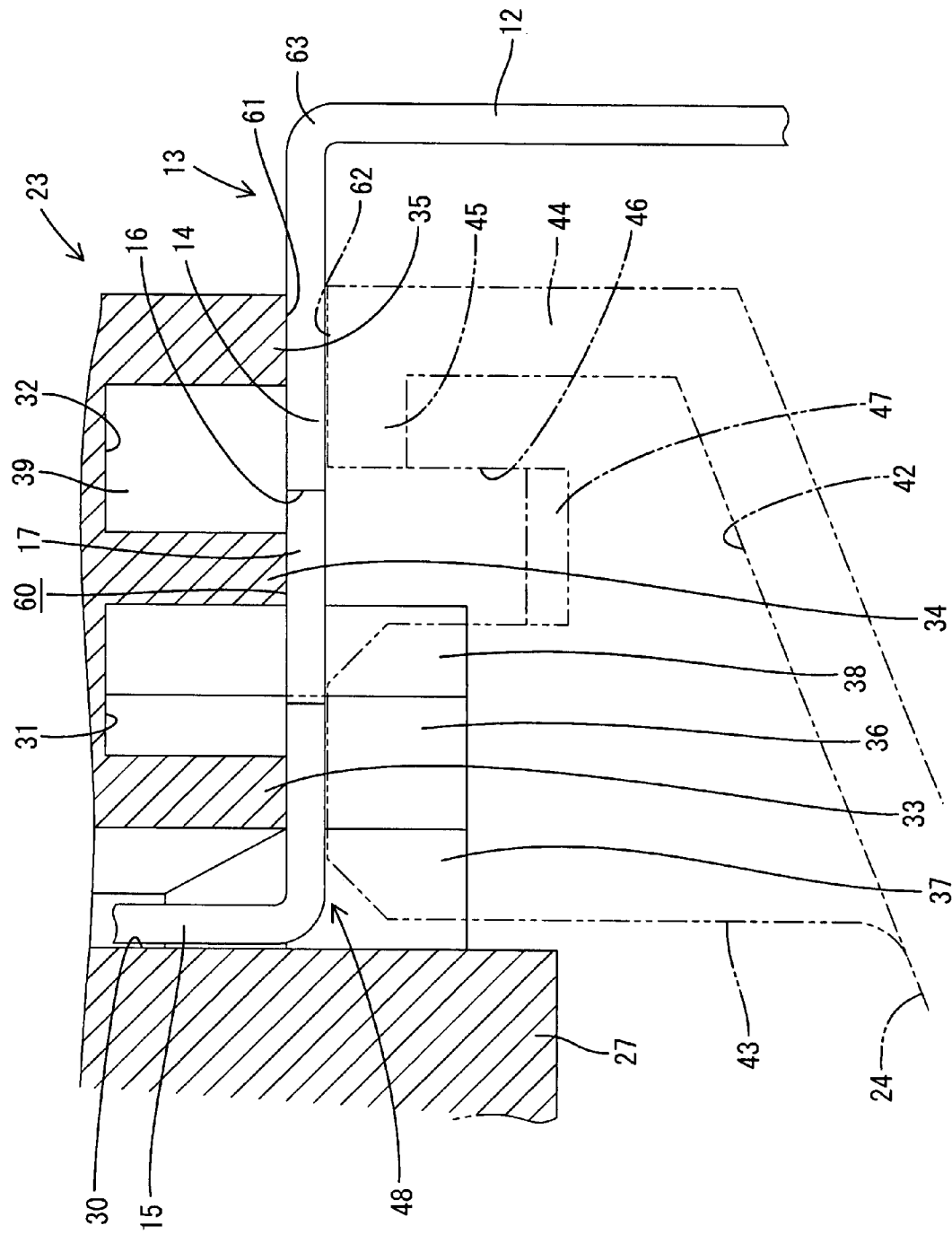
FIG. 5 is a partially enlarged vertical sectional view showing the through passage of a terminal part.
Figure 6:
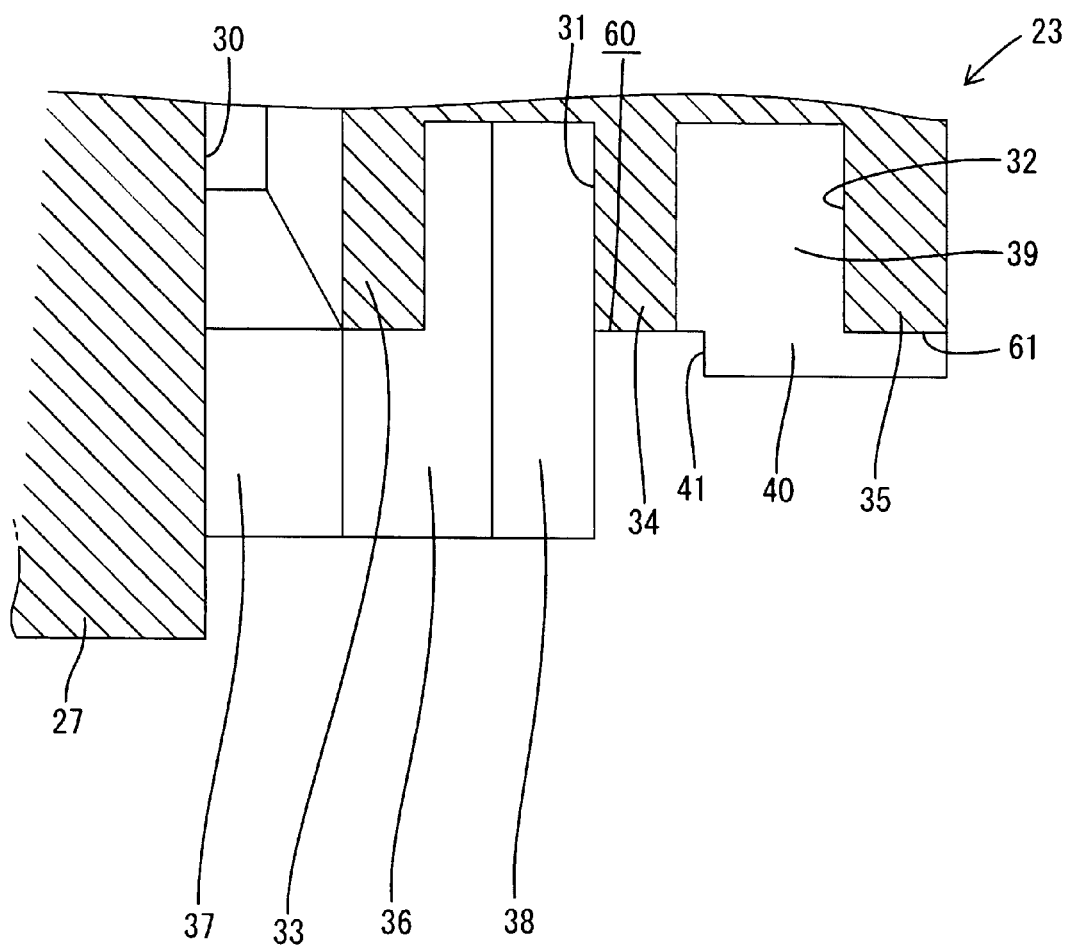
FIG. 6 is a partially enlarged vertical sectional view showing the shape of the fuse block.

The circuit constituent 10 is constructed by including a circuit board 11 with a board surface facing in the vertical direction, a plurality of bus bars 12 which are laid along a back surface of the circuit board 11 (right surface in FIG. 2), and a switching member 19 such as a relay which is mounted on a front surface side of the circuit board 11 (left surface side in FIG. 2). The bus bar 12 is bonded on the back surface of the circuit board 11. A first terminal part 13 formed at an upper end portion of the bus bar 12 is protruded from an upper end edge of the circuit board 11, and a second terminal part 18 formed at a lower end portion of the bus bar 12 is protruded from a lower end edge of the circuit board 11.

The first terminal part 13 is constituted of a plate-shaped horizontal portion 14 protruded in the horizontal direction forward perpendicularly from an upward upper end portion 63 of the bus bar 12, and a plate-shaped fuse terminal 15 protruded upward perpendicularly from a front end of the horizontal portion 14. The fuse terminal 15 is formed into a shape (branched into two) for connection with a fuse (not shown). A pair of recess portions 16 formed in the horizontal portion 14, such that left and right side edges of the horizontal portion 14 are notched in longitudinally oriented rectangles. The area with the recess portions 16 formed (of the horizontal portion 14) is a narrow width portion 17 which is smaller in width dimension than a front area and a rear area from it. The narrow width portion 17 is formed over areas corresponding to a rear end portion of an upper side first recessed portion 31 and a front end portion of an upper side second recessed portion 32 which will be described later.

The case 20 is constructed by including a frame 21 which is formed by an insulating material such as a synthetic resin, and is formed into a substantially square frame shape continuously surrounding the circuit constituent 10 over an entire periphery along a peripheral edge of the circuit board 11.

Further, case 20 includes a metal heat sink plate 22 which is fixed to the frame 21 so as to close an opening on its back side, a fuse block 23 of a synthetic resin which is assembled to the frame 21 from its upper side, a cover 24 of a synthetic resin which is assembled to the frame 21 so as to cover the circuit board 11 and the switching member 19 housed inside the frame 21 by closing an opening of its front surface side (side opposite from the heat sink plate 22), a first housing 25 of a synthetic resin which is assembled to the fuse block 23, and a second to a fourth housings 26 of a synthetic resin which are assembled to the lower edge portion of the frame 21.

The fuse block 23 is constituted of a horizontally long body part 27 which is placed along a front surface (front) of the upper edge portion of the frame 21, and a pair of arm parts 28 in a form in which they are extended downward from both a left and a right end portions of the body part 27 in an open side shape. On a top surface of the body part 27, a fuse mounting part 29 for housing a fuse (not shown) is formed to be protruded in a square block shape upward from the top surface of the body part 27, and in the state opened to the top surface side. A housing groove 30 in the shape penetrated through vertically is formed in the fuse mounting part 29, and a fuse terminal 15 of the first terminal part 13 is housed inside the housing groove 30.

When the fuse is mounted from above the fuse mounting part 29, a downward force is applied to the fuse terminal 15. Thereby, a force is applied to bus bar 12 in the direction in which the horizontal portion 14 lowers with the upward upper end portion 63 of the bus bar 12 as the support point. When the fuse is pulled out of the fuse mounting part 29, the upward force is applied to the fuse terminal 15. Thereby, a force is applied to the bus bar 12 in the direction in which the horizontal portion 14 rises with the upward upper end portion 63 of the bus bar 12 as the support point.

Of a rear end portion of the body part 27, an outer surface of a lower wall of the body part 27 is made an upper side holding member 60 which abuts on the horizontal portion 14 from above to hold it when a force is applied to the bus bar 12 in a direction in which the horizontal portion 14 rises. An upper side opposing wall surface 61 is formed on the undersurface of the upper side holding member 60 to be opposed to the horizontal portion 14. On the upper side opposing wall surface 61, the upper side first recessed portion 31 and the upper side second recessed portion 32 (which are square-shaped in section slim and laterally longer) are arranged in a longitudinal direction (a penetrating direction of the horizontal portion 14 in the through passage 48), and are formed in a shape opened to only the undersurface of the body part 27. The two upper side recessed portions 31 and 32 are located rearward of the housing groove 30, a portion between the housing groove 30 and the upper side first recessed portion 31 becomes a first wall portion 33 formed into a plate shape long in the lateral direction and protruded downward. A portion between the upper side first recessed portion 31 and the upper side second recessed portion 32 becomes a second wall portion 34 which is formed into a plate shape long in the lateral direction and protruded downward. A portion between a rear surface wall of the body part 27 and the upper side second recessed portion 32 becomes a third wall portion 35 which is formed into a plate shape long in the lateral direction and protruded downward.

On the undersurface of the body part 27, a plurality of guide parts 36 are formed to protruded downward along the front surface of the second wall portion 34 from the ceiling surface of the upper side first recessed portion 31. The first terminal part 13 is disposed to be arranged in the lateral direction along the undersurface of the body part 27, and the guide part 36 is formed into a wall shape disposed to partition the adjacent first terminal parts 13. A front end edge of the guide part 36 is connected to an inner surface of a front side of the housing groove 30 (a front side in the entering direction when a liquid from outside the case 20 enters the inside of the case 20), and a rear end edge of the guide part 36 is connected to an inner wall surface (front surface of the second wall portion 34) at the rear side of the upper side first recessed portion 31 (back side in the liquid entering direction). As for the thickness dimension in the lateral direction of the guide part 36, a substantially front half portion becomes a narrow thin wall part 37. Further, a pair of a left and a right protruded portions 38 protrude in a square shape outside from its outer side surface and connecting to the inner wall surface of the rear side of the upper side first recessed portion 31 and are formed at the rear end portion of the guide part 36. The lower end portion of such a guide part 36 is protruded downward from the horizontal portion 14 of the first terminal part 13.

Further, a plurality of partition walls 39, which protrudes downward from the ceiling surface of the upper side second recessed portion 32 are formed on the undersurface of the body part 27, and the partition wall 39 is disposed to partition the adjacent first terminal parts 13. A front end edge of the partition wall 39 connects to the inner surface of the front side of the upper side second recessed portion 32, and a rear end edge of the partition wall 39 connects to the inner wall surface at the rear side of the upper side second recessed portion 32. The lower end of the partition wall 39 is made to have the same height as the undersurface of the body part 27. A positioning part 40 is formed to protruded downward from the undersurface (top surface of a horizontal penetrating portion) of the body part 27 and has the same width dimension as the partition wall 39 is formed at the partition wall 39. The positioning part 40 extends to be slim and long in the longitudinal direction (direction parallel with the liquid entering direction), and the protruded dimension downward from the partition wall 39 is made substantially the same dimension as the plate thickness of the horizontal portion 14 of the first terminal part 13. The forming range of the positioning part 40 in the longitudinal direction is an area from a position proximately rearward of the rear surface of the second wall part 34 (the inner wall surface at the front side of the upper side second recessed portion 32) to reach the rear surface of the third wall part 35.

Further, each of the positioning parts 40 and the above described guide part 36 are in the positional relationship arranged in the longitudinal direction. In detail, the positioning part 40 is located rearward of the guide part 36 (back side in the liquid entering direction), and a notched portion 41 is formed between the rear end of the guide part 36 and the front end of the positioning part 40.

The cover 24 is substantially similar to the circuit board 11 as a whole, and is formed into a shape in a size larger than the circuit board 11. An outer surface of an upper end portion of the cover 24 is an inclined surface 42 having an inclination downward to the front, and a plurality of ribs 43 (the lower side holding members that are the constituent features of the present invention) are formed at this inclined surface 42 at predetermined pitches in the lateral direction in the form protruding upward. A support wall 44 which is raised upward in the vertical direction from an upper end edge of the inclined surface 42 is formed at the cover 24, and an eaves part 45 is formed to be protruded forward from an upper end edge of the support wall 44. A rear end edge of the rib 43 continues to the support wall 44 and the eaves part 45. A lower side opposing wall surface 62 which is opposed to the horizontal portion 14 is formed at an upper end edge of the rib 43. A lower side recessed portion 46 in the form with its upper end edge notched into a square shape is formed in the lower side opposing wall surface 62. A rear surface of the lower side recessed portion 46 connects to a front end surface of the eaves part 45 to be flush with it. On the bottom surface of the lower side recessed portion 46, a pair of left and right taper surfaces 47 forming a shape of a ridge line which becomes narrower in width as it goes upward are formed. A top surface of the eaves part 45 is at the same height as an upper end surface of the rib 43, and constitutes an undersurface of the through passage 48, which will be described later, together with the upper end surface of the rib 43.

A space vertically sandwiched by the undersurface of the rear end portion of the body part 27 and the upper end portion of the cover 24 is the horizontal through passage 48 which is in the horizontally (longitudinal direction) penetrating through a peripheral edge portion (upper edge portion) of the case 20 from its inner surface side to the outer surface side. This is for housing the horizontal portion 14 of the above described first terminal part 13 in the state in which it is penetrated through it in the longitudinal direction. A rear end of the through passage 48 communicates with a space in the case 20, which is surrounded by the frame 21, the circuit board 11 and the cover 24 and houses the switching member 19. A front end of the through passage 48 communicates with a lower end of the housing groove 30 of the fuse mounting part 29, and the housing groove 30 is opened upward to the outside of the case 20. The top surface of the through passage 48 is constructed by the upper side holding member 60 formed at the undersurface of the body part 27 of the fuse block 23. An undersurface of the through passage 48 is constructed by the rib 43 which is formed by being raised upward from the outer surface of the cover 24.

Figure 7:
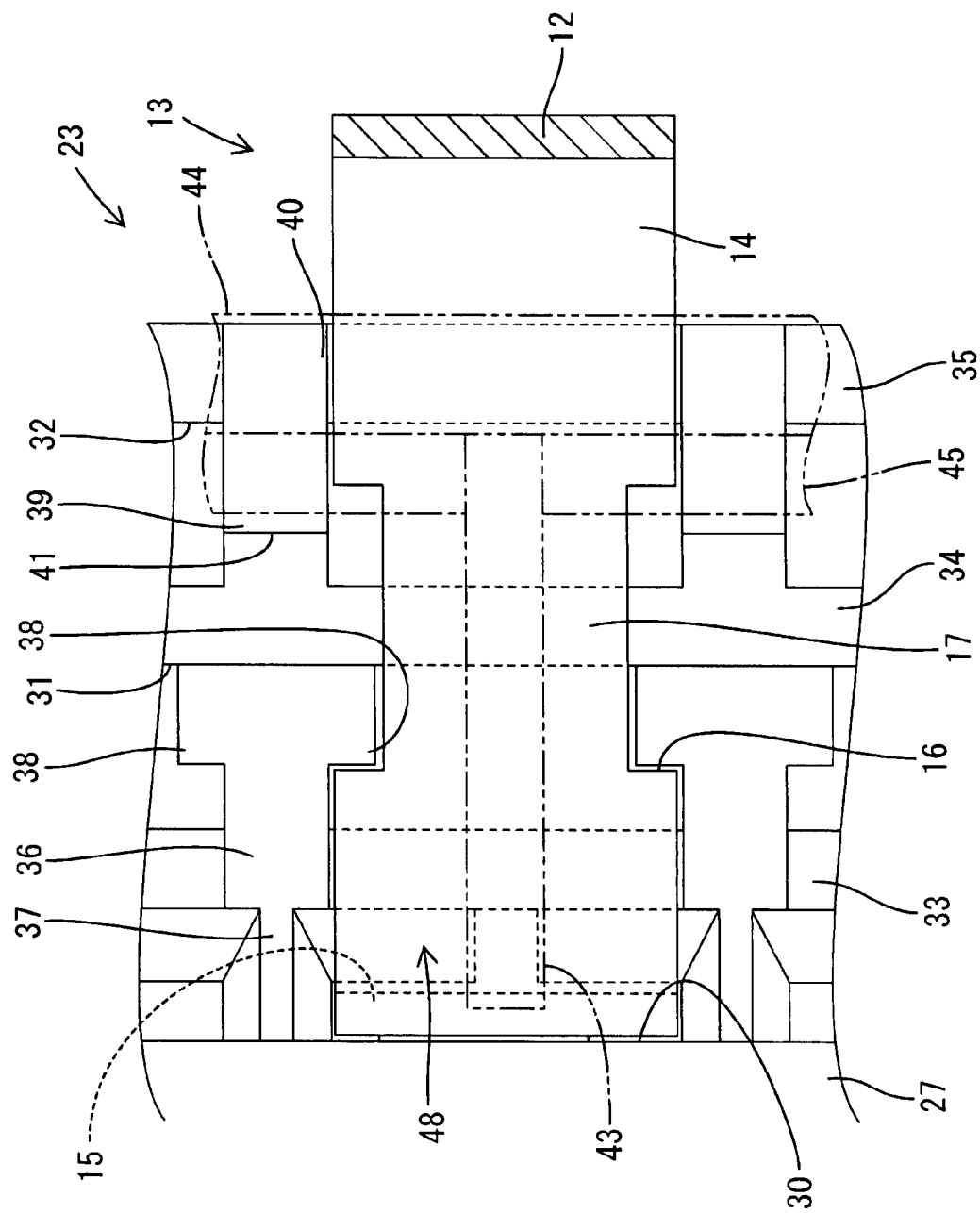
FIG. 7 is a bottom view showing the through passage of the terminal part.
Figure 8:
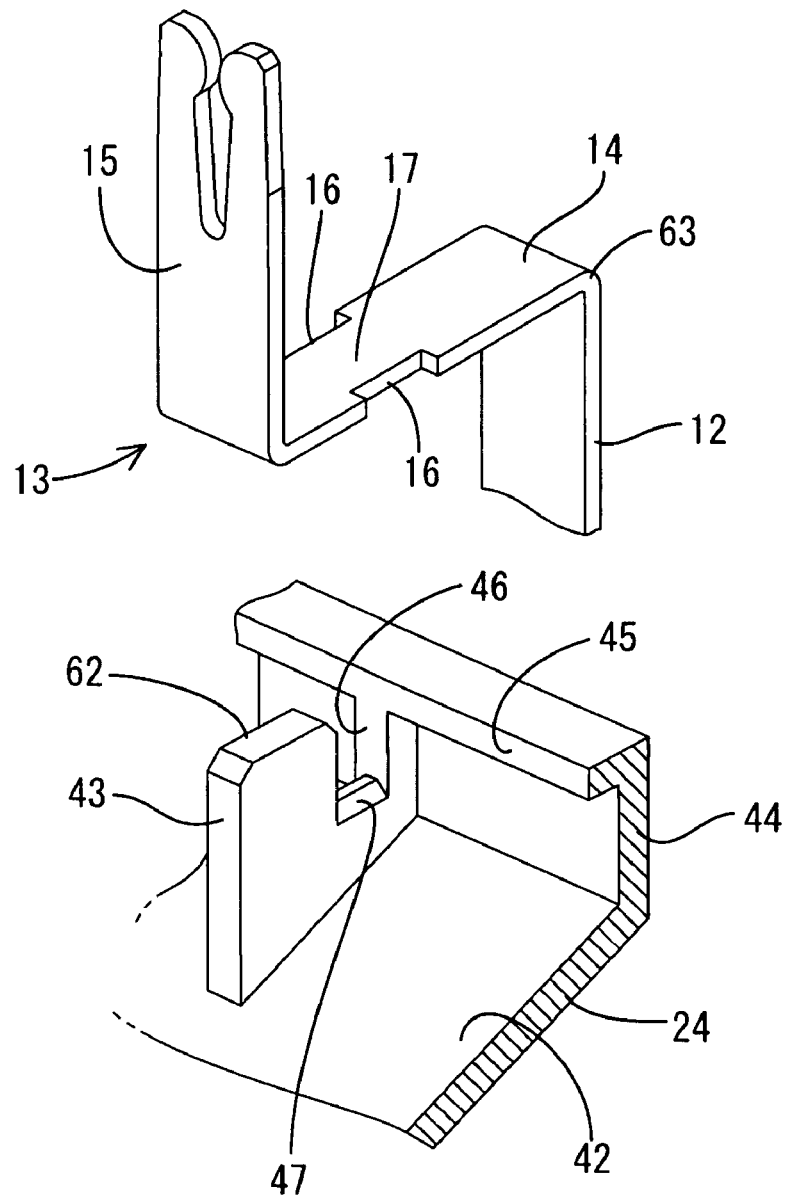
FIG. 8 is a perspective view showing the shape of the terminal part and the outer surface of the cover.

The horizontal portion 14 is led to an outside from the space housing the switching member 19 inside the case 20, at the rear end of the through passage 48. In an area forward of the eaves part 45, of the through passage 48, the undersurface of the through passage 48 is constructed by the rib 43 formed at the outer surface of the case 20. As shown in FIG. 7, the width dimension of the rib 43 is formed to be smaller than the width dimension of the horizontal portion 14. Therefore, of the undersurface of the horizontal portion 14, areas at both left and right sides of each of the ribs 43 (between the adjacent ribs 43) face a space outside the case 20, and the horizontal portion 14 is in the state in which it is led to the outside of the case 20.

Above the horizontal portion 14 of the first terminal part 13, which is housed inside the through passage 48, the first wall part 33, the second wall part 34 and the third wall part 35 of the upper side holding member 60 are located. Below the horizontal portion 14, the rib 43 is located.

As descried above, when the fuse is extracted from the fuse mounting part 29, an upward force is applied to the fuse terminal 15. Thereby, a force in the direction in which the horizontal portion 14 rises with the upward upper end portion 63 of the bus bar 12 as the support point is applied to the bus bar 12. At this time, the undersurfaces of the first to the third wall parts 33, 34 and 35 abut on the top surface of the horizontal portion 14 from above, and thereby, hold the horizontal portion 14 in the regular position. The undersurfaces of the first to the third wall parts 33, 34 and 35 may always abut on the top surface of the horizontal portion 14, or they may be in a construction such that they separate from it when the force in the direction in which the horizontal portion 14 rises is not applied to the bus bar 12, and they abut on it when the force in the direction in which the horizontal portion 14 rises is applied to the bus bar 12.

When the fuse is mounted to the fuse mounting part 29 from above as described above, a downward force is applied to the fuse terminal 15. Thereby, the force in the direction in which the horizontal portion 14 lowers with the upward upper end portion 63 of the bus bar 12 as the support point is applied to the bus bar 12. At this time, the top surface of the rib 43 abuts on the undersurface of the horizontal portion 14 from below, and thereby holds the horizontal portion 14 in the regular position. The top surface of the rib 43 and the undersurface of the horizontal portion 14 may always abut on each other, or may be in the construction such that they separate from each other when the force is not applied to the bus bar 12 in the direction in which the horizontal portion 14 lowers, but they abut on each other when the force is applied to the bus bar 12 in the direction in which the horizontal portion 14 lowers.

In this embodiment, the horizontal portion 14 of the first terminal part 13 housed in the through passage 48 is in the state in which the undersurfaces of the first wall part 33, the second wall part 34 and the third wall part 35 abut on its top surface, and the top surface of the rib 43 abuts on its undersurface. Namely, the body part 27 constituting the top surface of the through passage 48 can sandwich the horizontal portion 14 of the first terminal part 13 with the rib 43 constituting the undersurface of the through passage 48 in its portion where the recessed portions 31 and 32 are not formed (wall parts 33, 34 and 35), and therefore, the first terminal part 13 is reliably held.

The first to the third wall parts 33, 34 and 35 continuously abut on the horizontal portion 14 over its entire width, and the rib 43 abuts on the horizontal portion 14 at only the central position in the width direction. The first wall part 33 corresponds to the area at the front side from the lower side recessed portion 46 in the upper end surface of the rib 43, and in this portion, the horizontal portion 14 is vertically sandwiched. The second wall part 34 is located to correspond to the lower side recessed portion 46. The third wall part 35 corresponds to the area at the rear side from the lower side recessed portion 46 in the upper end surface of the rib 43 and the top surface of the eaves part 45.

Areas at both the left and right sides of each of the ribs 43 (between the adjacent ribs 43) of the undersurface of the through passage 48 become an opening 49 which causes the through passage 48 to communicate with an outside of the case 20. The lower end portion of the guide part 36 is protruded downward from the opening 49 so as not to contact or interfere with the rib 43, and is located above the inclined surface 42 of the cover 24. Further, the side surface of the guide part 36 which faces the inside of the upper first recessed portion 31 is in contact with or close vicinity to the side surface of the horizontal portion 14 except for the narrow thin wall part 37, and the protruded portion 38 at the rear end of the guide part 36 is fitted to the front end portion of the recess portion 16. In other words, the guide part 36 is in the form extending downward from the horizontal portion 14 along the side edge of the horizontal portion 14.

Next, an operation of this embodiment will be described.

It is feared that when the fuse terminal 15 of the first terminal part 13 is housed in the housing groove 30 of the fuse block 23, if the fuse terminal 15 is caught by the inner wall surface of the housing groove 30, the horizontal portion 14 of the first terminal part 13 deflects downward and deforms with the upward upper end portion 63 of the bus bar 12 as the support point, resulting in the fuse terminal 15 not being housed in the regular position in the housing groove 30. In view of the above described respect, in this embodiment, when the force in the direction to lower the horizontal portion 14 is applied to the bus bar 12, the top surface of the rib 43 abuts on the undersurface of the horizontal portion 14 from below and thereby, holds the horizontal portion 14 at the regular position. Thereby, the fuse terminal 15 can be housed at the regular position in the housing groove 30.

When the fuse is fitted from above the fuse mounting part 29, a downward force is applied to the fuse terminal 15. Thereby, the force is applied to the bus bar 12 in the direction in which the lower the horizontal portion 14 lowers with the upward upper end part 63 of the bus bar 12 as the support point. Then, the top surface of the rib 43 abuts on the undersurface of the horizontal portion 14 from below and thereby, can hold the horizontal portion 14 at the regular position.

Further, when the fuse is extracted from the fuse mounting part 29, the upward force is applied to the fuse terminal 15. Thereby, the force is applied to bus bar 12 in the direction in which the horizontal portion 14 rises with the upward upper end part 63 of the bus bar 12 as the support point. Then, the undersurfaces of the first to the third wall parts 33, 34 and 35 abut on the top surface of the horizontal portion 14 from above, and thereby, can hold the horizontal portion 14 at the regular position.

In addition, the horizontal portion 14 of the first terminal part 13, which is housed in the through passage 48, is in the state in which the undersurfaces of the first wall part 33, the second wall part 34 and the third wall part 35 abut on the top surface thereof, and the top surface of the rib 43 abuts on the undersurface thereof. Namely, the body part 27 which constitutes the top surface of the through passage 48 can sandwich the horizontal portion 14 of the first terminal part 13 with the rib 43 which constitutes the undersurface of the through passage 48 in its portions where the recessed portions 31 and 32 are not formed (wall parts 33, 34 and 35), and therefore, can reliably hold the first terminal part 13.

Even if the liquid outside the case 20 enters the gap between the inner surface of the through passage 48 and the surface of the horizontal portion 14 of the first terminal part 13 from the housing groove 30 of the fuse mounting part 29, and moves toward the inner side (rear side) of the case 20 inside the through passage 48 due to capillarity, the gap between the top surface (inner surface) of the through passage 48 and the top surface (front surface) of the horizontal portion 14 is significantly enlarged in both the recessed portions 31 and 32 of the body part 27, and therefore, entry of the liquid due to capillarity is shut off at the recessed portions 31 and 32. In addition, the upper side first recessed portion 31 and the upper side second recessed portion 32 (at the top surface side) are formed at two locations spaced from each other in the penetrating direction of the horizontal portion 14 (liquid entering direction). Therefore, even if a liquid passes through the upper side first recessed portion 31 at the front side in the entering direction, entry of the liquid can be reliably shut off in the upper side second recessed portion 32 located at the back side in the entering direction. In the lower side recessed part 46 of the rib 43, the gap between the undersurface (inner surface) of the through passage 48 and the undersurface (front surface) of the horizontal portion 14 is significantly enlarged. Therefore, entry of the liquid due to capillary is shut off at the lower side recessed portion 46. Thereby, entry of a liquid into the case 20 is prevented.

The rib 43 constituting the undersurface of the through passage 48 is provided at the outer surface side of the cover 24 (case 20), and the opening at the upper end of the lower side recessed portion 46 formed at this rib 43 faces the through passage 48. Namely, the lower side recessed portion 46 is caused to communicate with the space outside the case 20 (cover 24). Accordingly, the liquid which reaches the lower side recessed portion 46 due to capillary, goes along the route continuing from the inner surface of the front side of the lower side recessed portion 46 and the left and right outer side surfaces of the rib 43 to reach the inclined surface 42 of the cover 24, and thus is discharged to the outside of the through passage 48. Since the undersurface of the lower side recessed portion 46 is formed into a ridge line shape and the liquid which reaches the undersurface of the lower side recessed portion 46 flows down to the left and right outer side surface sides along the inclination of the taper surface 47, the possibility of the liquid staying at the bottom surface of the lower side recessed portion 46 is reduced. Further, since the liquid which reaches the inclined surface 42 flows downward along the inclination, the liquid does not stay on the outer surface of the cover 24, thus excellent draining performance is provided. Thereby, entry of the liquid into the case 20 can be reliably prevented.

Since the guide part 36 in the form facing the upper side first recessed part 31 and extending downward from the horizontal portion 14 along the side edge of the horizontal portion 14 is formed on the undersurface of the body part 27, at least part of the liquid which reaches the upper side first recessed portion 31 in the top surface of the horizontal portion 14 is absorbed into the gap between the side surface of the horizontal portion 14 and the surface of the guide part 36 due to capillarity, and goes along the surface of the guide part 36 and thereby flows downward from the horizontal portion 14. Thereby, entry of water into the inside of the case 20 is suppressed.

The narrow width portion 17 in the form in which the area corresponding to the upper side first recessed portion 31 and the rear end portion of the guide part 36 is notched of its side edge portion is formed in the horizontal portion 14, and the protruded portion 38 in the form along the side edge of the narrow width portion 17 is formed in the guide part 36. Thereby, the liquid which reaches the top surface of the narrow width portion 17 of the terminal part in the upper side first recessed portion 31 goes along the surface of the protruded portion 38 and flows downward of the horizontal portion 14. The width of the horizontal portion 14 is narrow in the upper side first recessed portion 31, and therefore, as compared with the horizontal portion which is not narrow in width, the liquid which reaches the top surface of the horizontal portion 14 is easily in contact with the protruded portion 38 of the guide part 36.

Further, the rib 43 which constitutes the undersurface of the through passage 48 is in the form protruded from the outer surface of the case 20, and the area of the space below the horizontal portion 14, which does not interfere with the rib 43 becomes the space outside the case 20. A part of the undersurface of the through passage 48 (the area except for the rib 43) is made the opening 49 which communicates with the outside of the case 20. The lower end portion of the guide part 36 penetrates through the opening 49 to be disposed outside the case 20. Accordingly, the liquid which flows along the surface of the guide part 36 is reliably discharged outside the case 20.

The guide part 36 is formed along the inner wall surface located at the back side (rear side) in the liquid entering direction from the outside of the case 20, of the inner wall surface of the upper side first recessed part 31. Therefore, when the liquid which reaches the upper side first recessed part 31 to be absorbed into the gap between the undersurface of the inner wall (the second wall part 34) of the upper side second recessed portion 32 located at the back side in the liquid entering direction and the top surface of the horizontal portion 14, immediately before this, at least part of the liquid is absorbed into the gap between the side surface of the horizontal portion 14 and the front surface of the guide part 36. Thus, entry of the liquid into the case 20 can be suppressed.

A plurality of horizontal portions 14 are arranged in parallel in the lateral direction, and the positioning part 40 which is protruded downward from the top surface of the through passage 48 and the guide part 36 are disposed between the adjacent horizontal portions 14, and when the positioning part 40 is disposed between the adjacent horizontal portions 14 like this, it is feared that a liquid enters the gap between the side surface of the positioning part 40 and the side surface of the horizontal portion 14 due to capillarity. However, in this embodiment, the positioning part 40 is disposed at the backside (rear side) in the liquid entering direction from the guide part 36, and the positioning part 40 and the guide part 36 are partitioned by the notched portion 41 to being discontinuous form. Therefore, a liquid is absorbed downward of the horizontal portion 14 along the guide part 36 before it reaches the positioning part 40, and the liquid can be prevented from entering the gap between the positioning part 40 and the terminal part.

Other Embodiments

The present invention is not limited to the embodiment described based on the above description and the drawings, but, for example, the following embodiments are included in the technical range of the present invention.

(1) In the above described embodiment, the two recessed portions are formed in the upper side holding member, but according to the present invention, the number of the recessed portions formed in the upper side holding member may be only one or three or more.

(2) In the above described embodiment, the lower side holding member is made a rib in the wall shape, but according to the present invention, the lower side holding member may be formed into a block shape which abuts on the terminal part along the entire width.

(3) In the above described embodiment, the narrow width portion is formed by notching the left and right both side edge portions of the terminal part, but according to the present invention, the narrow width portion may be in the form in which only one of the left and right side edges is notched.

(4) In the above described embodiment, the guide part is in the form connecting to the wall part between the recessed portions, but according to the present invention, the guide part may be formed to be suspended from the ceiling surface of the recessed portion without connecting to the wall part.

(5) In the above described embodiment, the recessed portions are formed on both the top surface of the lower side holding member and the undersurface of the upper side holding member, but according to the present invention, the recessed portion may be formed on only the top surface of the lower side holding member or on only the undersurface of the upper side holding member.

(6) In the above described embodiment, the guide part is formed in the holding member at the upper side, but according to the present invention, the construction in which the guide part is not formed may be adopted.

(7) In the above described embodiment, the guide part is formed along the inner wall surface located at the back side in the entering direction of the liquid from the outside of the case, of the inner wall surface of the recessed portion, but according to the present invention, it may be formed in the inner wall surface other than the inner wall surface at the back side in the liquid entering direction.

(8) In the above described embodiment, the positioning part is disposed at the back side in the liquid entering direction from the guide part, but according to the present invention, the positioning part may be disposed at the front side in the liquid entering direction from the guide part.

(9) In the above described embodiment, the notched portion which partitions the positioning part and the guide part is formed at the undersurface of the upper side holding member, but according to the present invention, such a notched portion is not formed and the positioning part and the guide part may be in the form continuing.

(10) In the above described embodiment, the positioning part is in the form extending to the front side from the wall part located at the furthest back side in the liquid entering direction, but according to the present invention, the positioning part may be in the form further extending to a back side from the wall part located at the furthest back side in the liquid entering direction.

(11) In the above described embodiment, the recessed part located at the front side in the liquid entering direction is in the form opening to only the underside of the holding member at the upper side, but according to the present invention, the recessed part located at the front side in the liquid entering direction may be in the form opening to both the undersurface and the front surface of the holding member at the upper side.

(12) In the above described embodiment, the guide part is in the form protruding forward (front side in the liquid entering direction) from the front surface of the wall part, but according to the present invention, the guide part may be in the form in which the rear end portion (back end portion in the liquid entering direction) of the guide part extends downward from the undersurface of the wall part.

The invention claimed is:

1. An electrical connection box, comprising:
a case including a circuit board;
a bus bar which is electrically connected to said circuit board and extends outside said case, wherein the bus bar includes a horizontal portion positioned in an area outside said case and extends in a horizontal direction;
a lower side holding member of said case positioned below said horizontal portion of said bus bar, and holds said horizontal portion from below when a force is applied to said bus bar in a direction in which said horizontal portion lowers;
an upper side holding member of said case positioned above said horizontal portion of said bus bar, and holds said horizontal portion from above when a force is applied to said bus bar in a direction in which said horizontal portion rises; and
a recessed portion which is positioned in at least one of a lower side opposing wall surface opposed to said horizontal portion of said bus bar, of said lower side holding member, and an upper side opposing wall surface opposed to said horizontal portion of said bus bar, of said upper side holding member, thereby providing a clearance from said horizontal portion.

2. An electrical connection box, comprising:
a case including a circuit board;
a bus bar which is electrically connected to said circuit board, and includes a horizontal portion positioned outside said case and extending in a horizontal direction;
a lower side holding member of said case positioned below said horizontal portion of said bus bar, and holds said horizontal portion from below when a force is applied to said bus bar in a direction in which said horizontal portion lowers; and
a recessed portion defined in a lower side opposing wall surface opposed to said horizontal portion of said bus bar, of said lower side holding member to provide a clearance from said horizontal portion.

3. An electrical connection box, comprising:
a case including a circuit board;
a bus bar which is electrically connected to said circuit board and positioned outside said case;
a horizontal portion of said bus bar is positioned outside said case;
an upper side holding member of said case positioned above said horizontal portion of said bus bar, and holds said horizontal portion from above when a force is applied to said bus bar in a direction in which said horizontal portion rises; and
a recessed portion positioned in an upper side opposing wall surface opposed to said horizontal portion of said bus bar, of said upper side holding member to provide a clearance from said horizontal portion.

4. The electrical connection box according to claim 1, wherein said lower side holding member is a rib formed to be raised upward from an outer surface of said case, and said recessed portion is formed in an upper end edge of said rib.

5. The electrical connection box according to claim 4, wherein said outer surface of said case is made an inclined surface.

6. The electrical connection box according to claim 5, wherein said case includes a fuse block having a fuse mounting part which opens upward to allow a fuse to be mounted therein, the fuse mounting part is positioned above said horizontal portion of said bus bar,
wherein an end portion of said horizontal portion is capable of being bent upward and led into said fuse mounting part to be a fuse terminal; and
wherein said upper side holding member is provided on an outer surface of a lower wall of said fuse block.

7. The electrical connection box according to claim 6, wherein said recessed portions are formed in a plurality of positions spaced from each other in a direction in which said horizontal portion extends.

8. The electrical connection box according to claim 7, wherein a guide part faces said recessed portion and extends downward from said horizontal portion along a side edge of said horizontal portion, and is positioned at said upper side holding member.

9. The electrical connection box according to claim 8, wherein a narrow width portion is formed in said horizontal portion and includes a side edge portion notched; and
wherein a protruded portion is formed in said guide part and is positioned along a side edge of said narrow width portion.

10. The electrical connection box according to claim 9, wherein said guide part is formed along an inner wall surface located at a back side in an entering direction of a liquid from outside said case, of inner wall surfaces of said recessed portions.

11. The electrical connection box according to claim 10, wherein a plurality of said horizontal portions are arranged in parallel;
wherein a positioning part that protrudes downward from the outer surface of the lower wall of said fuse block and said guide part are disposed between said horizontal portions adjacent to each other;
wherein said positioning part is located at a back side in the liquid entering direction from said guide part; and wherein a notched portion which partitions said positioning part and said guide part is formed at the lower wall of said fuse block.

12. The electrical connection box according to claim 1,
wherein said case includes a fuse block having a fuse mounting part capable of opening upward to allow a fuse to be mounted therein and is positioned above said horizontal portion of said bus bar,
wherein an end portion of said horizontal portion is structured to be bent upward and led into said fuse mounting part to function as a fuse terminal; and
wherein said upper side holding member is provided on an outer surface of a lower wall of said fuse block.

13. The electrical connection box according to claim 1,
wherein said recessed portions are formed in a plurality of positions spaced from each other in a direction in which said horizontal portion extends.

14. The electrical connection box according to claim 1,
wherein a guide part faces said recessed portion and extends downward from said horizontal portion along a side edge of said horizontal portion, and is positioned at said upper side holding member.

15. The electrical connection box according to claim 14,
wherein a narrow width portion includes a side edge portion that is notched and positioned in said horizontal portion; and
wherein a protruded portion is positioned along a side edge of said narrow width portion and is formed in said guide part.

16. The electrical connection box according to claim 14,
wherein said guide part is formed along an inner wall surface located at a back side in an entering direction of a liquid from outside said case.

17. The electrical connection box according to claim 14,
wherein a plurality of said horizontal portions are arranged in parallel;
wherein a positioning part extends downward from the outer surface of the lower wall of said fuse block and said guide part is disposed between said horizontal portions adjacent to each other;
wherein said positioning part is located at a back side in the liquid entering direction from said guide part; and
wherein a notched portion partitions said positioning part and said guide part and is formed at the lower wall of said fuse block.

18. The electrical connection box according to claim 2,
wherein said lower side holding member is a rib formed to be raised upward from an outer surface of said case, and said recessed portion is formed in an upper end edge of said rib.

19. The electrical connection box according to claim 18,
wherein said outer surface of said case is made an inclined surface.

20. The electrical connection box according to claim 18,
wherein in said case, a fuse block having a fuse mounting part which opens upward to allow a fuse to be mounted therein is provided at a position above said horizontal portion of said bus bar,
wherein an end portion of said horizontal portion is formed to be bent upward and led into said fuse mounting part to be a fuse terminal; and
wherein said upper side holding member is provided on an outer surface of a lower wall of said fuse block.

* * * * *